United States Patent [19]
Nolet et al.

[11] Patent Number: 5,098,741
[45] Date of Patent: Mar. 24, 1992

[54] METHOD AND SYSTEM FOR DELIVERING LIQUID REAGENTS TO PROCESSING VESSELS

[75] Inventors: Alan D. Nolet, Los Altos; Lloyd F. Wright, Castro Valley; Robert A. Maraschin, Cupertino, all of Calif.

[73] Assignee: Lam Research Corporation, Fremont, Calif.

[21] Appl. No.: 535,434

[22] Filed: Jun. 8, 1990

[51] Int. Cl.⁵ ............................................. C23C 16/00
[52] U.S. Cl. ................................... 427/248.1; 118/50; 118/692; 118/710; 118/715
[58] Field of Search ................. 118/715, 692, 710, 50; 427/248.1; 156/345, 610, 646, DIG. 103; 110/189; 148/DIG. 169; 422/129

[56] References Cited

U.S. PATENT DOCUMENTS 4,847,469  7/1989  Hofmann et al. .................... 118/715
4,849,259  7/1989  Biro et al. .......................... 427/248.1

OTHER PUBLICATIONS

Application Note, Solid State Tech. Mar. 1990, p. 40.

Primary Examiner—Shrive Beck
Assistant Examiner—Terry J. Owens
Attorney, Agent, or Firm—Townsend and Townsend

[57] ABSTRACT

A system for delivering a liquid reagent to a low pressure reactor in the vapor phase includes a source of the liquid reagent, a metering valve for measuring precise volumes of the liquid reagent and transporting those volumes to an expansion valve at a precisely controlled flow rate, and a vaporizing chamber. The expansion valve includes an adjustable orifice which is adjusted in response to pressure disturbances upstream of the expansion valve so as to decrease variations of the liquid flow rate to the expansion valve and thereby enhance uniformity of the vapor phase flow rate downstream of the expansion valve.

19 Claims, 1 Drawing Sheet

METHOD AND SYSTEM FOR DELIVERING LIQUID REAGENTS TO PROCESSING VESSELS

BACKGROUND OF THE INVENTION

The present invention relates to systems and methods for delivering liquid reagents to processing equipment. More particularly, it relates to the delivery of liquid reagents which are vaporized under controlled conditions as they enter a low pressure environment.

Chemical vapor deposition (CVD) processes are useful for forming thin, solid films on a heated substrate as a result of thermochemical vapor-phase reactions. Such processes are widely used in the semiconductor industry to form epitaxial and non-epitaxial layers on semiconductor substrates, commonly referred to as wafers. Typically, a vapor-phase reactant is introduced to a low pressure reactor, where the reactant reacts with the heated surface of the semiconductor wafer. Depending on the nature of the vapor-phase reactant, a variety of conductive, semiconductive, and dielectric layers may be formed.

The use of liquid reagents, while highly desirable for reasons of safety and environmental protection, presents a number of difficulties in the design and control of systems for reagent delivery. First, the volumes of liquid reagents being manipulated are very small compared to the corresponding gas volumes for the same amount of reagent. The ability to precisely control such small liquid volumes is inherently less reliable. Indeed, the liquid-phase volumetric flow rates being handled are typically in the range from about 1 ml/min. to 50 ml/min., which is below the capability of many flow valves and feedback flow controllers. A second problem arises from the presence of dissolved gases in the liquid reagents. Some dissolved gas is present in liquid reagents from most sources, and the use of pressurized nitrogen delivery systems (which is common in many liquid delivery systems) exacerbates the problem. In particular, the dissolved gases evolve from the liquid as the liquid is flashed across the metering valve into a lower pressure environment. Such evolving gases cause erratic two phase flow in the orifice of the metering valve, which in turn can cause erratic pressure variations upstream of the valve. These pressure fluctuations cause substantial flow variations through the valve which cannot be adequately offset by the control systems utilized. Such flow variations make it difficult to control the total amount of reagent delivered as well as to control the precise flow rate. Control of both these parameters is critical in most semiconductor fabrication processes.

To overcome these problems, many systems now utilize a vaporizer upstream of the flow control valve. In this way, the problems inherent in controlling very low volumetric flow rate of the liquid reagent may be avoided. While workable, such upstream vaporization requires very accurate temperature control of the vaporizer, vapor delivery lines, vapor flow rate measurement system, and metering valves, since the mass flow rate of the gas is a function of temperature and vapor pressure of the liquid. The flow controllers used in these systems require very accurate calibration for each type of reagent and cannot be used with another reagent without extensive recalibration. Thus, systems which use an upstream vaporizer are generally costly, complex, and of marginal accuracy.

Another approach for controlling the flow of a liquid reagent into a reactor relies on bubbling a known quantity of a non-reactive gas, usually nitrogen, through the liquid under controlled conditions of temperature and pressure. In this way, the effect of gas evolution as the liquid flashes across the metering valve can be more accurately taken into account and controlled. Such an approach, however, requires very accurate (and therefore costly) pressure and temperature control within the bubbler and can cause droplet entrainment as the gas enters the reactor.

For these reasons, it would be desirable to provide systems and methods which provide accurate metering and delivery of liquid phase reagents to semiconductor and other processing equipment, particularly low pressure reactors, such as chemical vapor deposition reactors. It would be particularly desirable if such systems could delivery a precisely measured volume of liquid reagent to the reactor without the necessity of upstream temperature control and that such systems could be used on a wide variety of reagents without the necessity of recalibration. Such systems should also be of simple design, be relatively inexpensive, and be capable of handling very low flow rates without substantial fluctuation, even when the liquids being delivered have relatively high levels of dissolved gases.

SUMMARY OF THE INVENTION

According to the present invention, a system for delivering a reagent to an environment in which the reagent vaporizes comprises an expansion valve connected to receive a preselected volume of the reagent in the liquid phase, typically at or near ambient pressure, and discharging the reagent into the reactor in the vapor phase. Typically, the environment will be a low pressure reactor, but it may also be a heated vessel or reactor which is maintained at a temperature above the boiling point of the liquid at any given pressure. By accurately controlling the volume and delivery rate of the liquid reagent to the valve, the amount and flow rate of vapor phase reagent to the low pressure reactor may be accurately controlled. The accuracy of the flow rate is further enhanced by utilizing a valve having an adjustable orifice which is varied to minimize upstream pressure disturbances which can result from dissolved gases flashing from the liquid as it passes through the valve orifice. In particular, the orifice is incrementally opened in response to upstream pressure increases and incrementally closed in response to upstream pressure decreases. Such pressure stabilization decreases variations in the liquid flow rate which would otherwise occur, greatly enhancing the uniformity of the vapor phase flow rate.

In the specific embodiment, the reactor is a chemical vapor deposition reactor and the liquid reagent is delivered from a suitable source by a positive displacement metering pump, usually a sealless bellows pump which is externally pressurized to near the operating pressure to reduce bellows deformation resulting from excessive differential pressure, often referred to as "squirm." The expansion valve is a self-actuated pressure reducing valve connected so that the valve orifice opens as the upstream pressure increases and closes as the upstream pressure decreases.

DESCRIPTION OF THE SPECIFIC EMBODIMENTS

Figure 1:
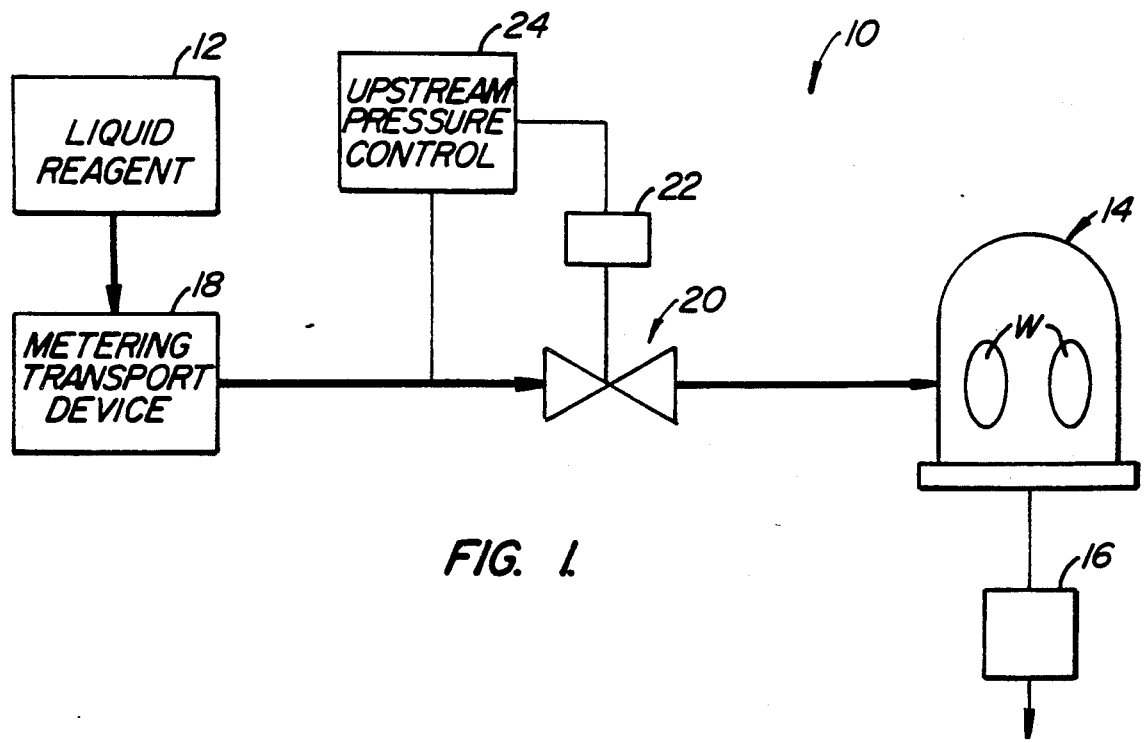
FIG. 1 is a block diagram illustrating the system of the present invention.

A system 10 for delivering a liquid reagent 12 to a low pressure reactor 14 in vapor form is schematically illustrated in FIG. 1. The reactor 14 will be connected to a low pressure pumping system 16 capable of maintaining a very low pressure within the reactor, typically being below about 500 Torr, usually being below about 100 Torr, more usually being below 50 Torr, and frequently being below about 25 Torr. The nature of the reactor 14 is not critical, with semiconductor fabrication reactors such as chemical vapor deposition (CVD), plasma-enhanced chemical vapor deposition (PECVD), plasma etch reactors, diffusion furnaces, oxide passivation systems, epitaxial reactors, chemical etchers, and the like, being illustrative. The illustrated reactor 14 is a CVD reactor having a plurality of semiconductor wafers W mounted in the interior.

The nature of the liquid reagent 12 will depend on the type of process which is being performed in the reactor 14. For CVD and other processes, suitable liquid reagents together with the corresponding solid phase material which is deposited on or diffused into the wafer are set forth in Table 1 as follows.

TABLE 1

| Liquid Reagent | Material Deposited |
| --- | --- |
| Trichlorosilane | Epitaxial silicon |
| Dichlorosilane | Epitaxial silicon |
| Tetraethylorthosilicate | $SiO_2$, phosphosilicate glass |
| Trimethylborate | Borophosphosilicate glass |
| Triethylborate | Borophosphosilicate glass |
| Trichloroethane | Oxide passivation |
| Boron tribromide | Boron diffusion |
| Phosphorus oxychloride | Phosphorus diffusion |

The liquid reagent will usually be contained in a suitable cylinder or bottle and delivered to a metering transport device 18 typically by pressurizing the liquid with a non-reactive gas, such as nitrogen.

The metering transport system 18 will be capable of measuring and delivering very accurate volumes of the liquid reagent to an expansion valve 20, as will be described in more detail hereinafter. The metering transport device 18 will be able to measure very small liquid volumes, typically being below about 500 ml, usually being below about 100 ml, usually being below about 50 ml, and frequently being in the range from about 5 to 50 ml. The device 18 will also be capable of delivering these volumes at a very steady delivery rate, typically in the range from about 1 to 100 ml/min, more usually in the range from about 1 to 25 ml/min, and frequently in the range from about 1 to 10 ml/min. Suitable metering transport devices 18 include various positive displacement metering pumps, such as piston pumps which are able to draw in a desired volume on a downstroke of the pump and to discharge the desired volume to the expansion valve 20 in a single upstroke of the piston.

Particularly suitable for the present invention will be bellows-type piston metering pumps, where the bellows prevents leakage of the liquid reagent around the piston seal. Such leakage prevention is desirable both because it increases the accuracy of the volumetric delivery of the pump and because it prevents the escape of potentially toxic chemicals from the delivery system. Moreover, the bellows seal prevents the leakage of air into the pressurized liquid region of the pump. Air can react with certain reagents which are to be delivered, often causing failure of conventional piston seals. When using bellows-type metering pumps, it will usually be desirable to pressure balance the external side of the bellows in order to reduce bellows "squirm" which can result from unbalanced operation.

Expansion valve 20 receives a preselected volume of liquid reagent from the metering transport device 18 and passes the liquid through an adjustable orifice. The upstream side of the valve 20 is generally at ambient pressure (although it could vary from ambient pressure somewhat so long as sufficient pressure is present to maintain the reagent in the liquid state) and the downstream side is generally at the same pressure as the inside of the reactor vessel 14. The liquid reagent will thus flash into the vapor phase as it passes from the upstream side of the valve 20 to the downstream side. The vaporized reagent then passes into the reactor 14.

As discussed above, however, the control of the mass flow rate of a flashing liquid through a valve can be problematic. This is particularly true of liquids which have substantial amounts of dissolved gases where the release of the gases can cause pressure variations in the upstream side of the valve. The liquid reagents of the present invention will generally have substantial amounts of dissolved gases, particularly when they are fed to the metering transport device 18 by pressurization with an inert gas as will usually be the case. Such pressure variations on the upstream side of the valve can, in turn, cause uncontrolled variations in the mass flow rate of the reagent through the valve. Such variations in the mass flow rate through the valve and to the reactor can have an adverse impact on the process which is being performed in the reactor.

To offset such uncontrolled pressure variations, the valve 20 is provided with an orifice having an adjustable size which can be incrementally opened and incrementally closed by an actuator 22. The actuator 22, in turn, is controlled by a control means 24 which senses the upstream pressure and can open the orifice of valve 20 in response to a pressure increase (thus lowering the upstream pressure) and close the valve in response to a pressure decrease (thus raising the upstream pressure). In the preferred embodiment, the valve 20, actuator 22, and control means 24 will all be combined in a self-contained pressure regulating valve having an upstream pressure tap 26 (FIG. 2), as described in more detail hereinafter. Alternatively, a discrete pressure controller, such as a commercially available digital or pneumatic pressure controller, can be provided to sense the upstream pressure and provide an appropriate control signal to a conventional actuator 22. The actuator will then position the valve orifice as described above.

Figure 2:
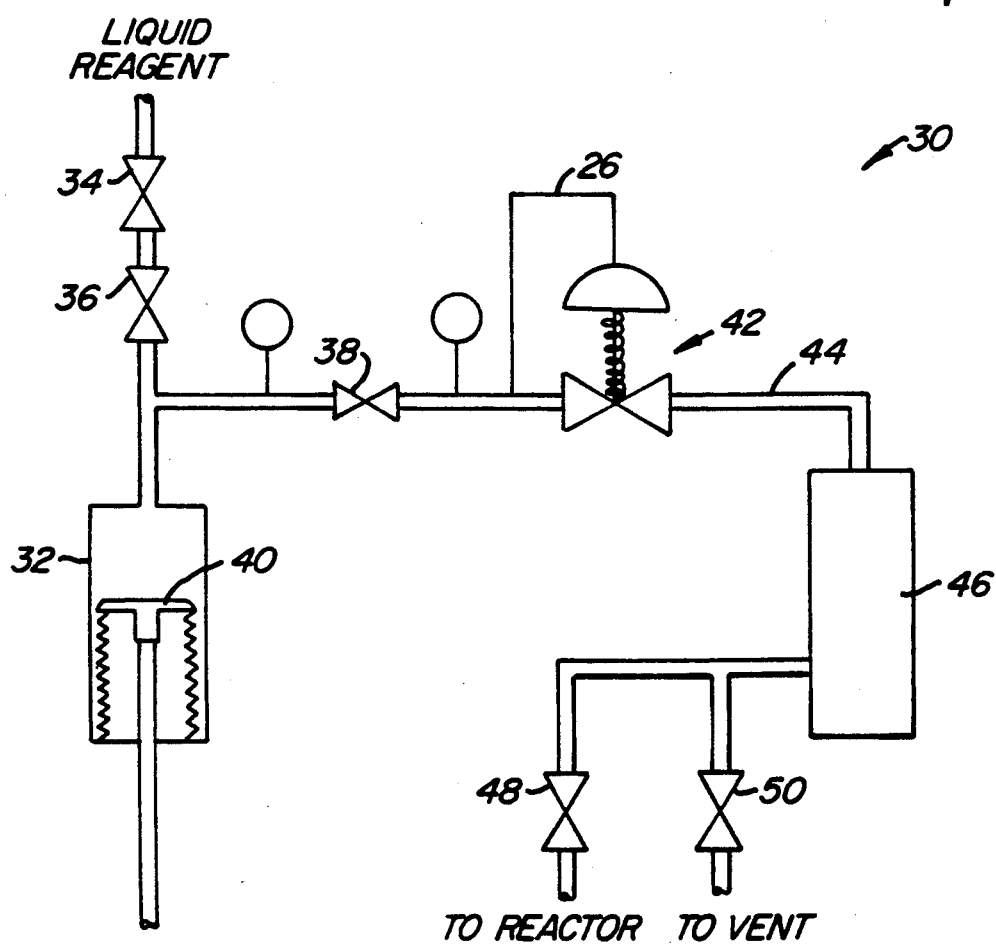
FIG. 2 is a schematic flow diagram illustrating a particular embodiment of the reagent delivery system of the present invention.

Referring now to FIG. 2, a flow diagram for a particular embodiment of the reagent delivery system of the present invention will be described. Liquid reagent is fed to a bellows-type metering pump 32 through an isolation valve 34 and fill valve 36. During the fill cycle, both isolation valve 34 and fill valve 36 are open while a delivery valve 38 is closed. The liquid reagent is drawn into the metering pump by stroking piston 40 to draw the liquid into the interior of the pump. It will be appreciated that the volume drawn into the pump can be very accurately controlled.

After the liquid reagent is drawn into metering pump 32, the fill valve 36 is closed and the delivery valve 38 is opened. Metering pump 32 is discharged by stroking piston 40 to expel the liquid from the pump. The liquid passes through a self-contained pressure regulating valve 42 which is set to maintain an upstream pressure in the range from about 5 to 30 psig. The liquid reagent then passes from the valve 42 through a conduit 44 (typically a very small bore) into a vaporizing chamber 46. The liquid reagent flashes as it enters the vaporizing chamber 46 where sufficient heat is supplied to provide the necessary heat of vaporization to allow as formation without residual droplets or fogging. The vaporized reagent then passes from vaporizer 46 through a delivery valve 48 to the reactor, as described above. A vent valve 50 is also provided so that the system may be cleared without delivering reagent to the reactor.

An exemplary semiconductor process utilizing the system and method of the present invention involves oxide CVD using a liquid tetraethylorthosilicate (TEOS) reagent. A 5 psig TEOS source at room temperature is connected to bellows pump 32, as illustrated in FIG. 2. Pump 32 draws a liquid volume of about 5 to 10 ml and discharges that volume over 3 to 5 minutes through valve 42 which maintains a 20 psig back pressure. During the discharge cycle, a pressure of 15 psig is maintained externally on the bellows of pump 15 to reduce bellows deformation resulting from unbalanced differential pressure. From valve 42, the liquid TEOS flashes into vaporizer 46 which is maintained at a temperature of about 200° C. and a pressure of about 10 Torr. From the vaporizer, vapor phase TEOS flow into the CVD reactor which is maintained at a pressure of about 1 Torr.

Although the foregoing invention has been described in detail for purposes of clarity of understanding, it will be obvious that certain modifications may be practiced within the scope of the appended claims.

What is claimed is:

1. A system for delivering a liquid reagent to an environment in which the reagent exists in vapor form, said system comprising:
   means for transporting a preselected volume of the liquid reagent in the liquid phase;
   a valve connected to the transporting means to receive the preselected volume of liquid reagent from the transporting means and to discharge vaporized reagent to the environment, said valve having an adjustable orifice size; and
   means for adjusting the orifice size in response to the pressure of the liquid reagent upstream of the valve where the orifice is opened as the upstream pressure increases, whereby downstream pressure perturbances are minimized.

2. A low pressure reactor system comprising:
   a low pressure reactor;
   means for maintaining a pressure below about 500 Torr within the low pressure reactor;
   a source of a liquid reagent;
   means for transporting a preselected volume of the liquid reagent in the liquid phase;
   a pressure reducing valve connected to the transporting means to receive the preselected volume of liquid reagent from the transporting means and to discharge vaporized reagent to the low pressure reactor, said pressure reducing valve having an adjustable orifice size;
   means for adjusting the orifice size of the pressure reducing valve in response to the pressure of the liquid reagent upstream of said pressure reducing valve, where the pressure reducing valve is opened as the upstream pressure increases, whereby downstream pressure perturbations are minimized; and
   means for delivering the vaporized reagent from the pressure reducing valve to the low pressure reactor.

3. A system as in claim 1 or 2, wherein the means for transporting includes a positive displacement metering pump.

4. A system as in claim 3, wherein the positive displacement metering pump is a bellows pump which is pressure balanced to reduce deformation of the bellows.

5. A system as in claims 1 or 2, wherein the means for adjusting the orifice comprises a spring diaphragm assembly which is fluidly connected to the liquid reagent upstream of the valve, whereby a pressure increase in the liquid reagent upstream of the value acts to open the orifice.

6. A system as in claims 1 or 2, wherein the means for adjusting the orifice comprises a valve actuator and a separate controller which positions the valve actuator in response to the upstream liquid reagent pressure.

7. A system as in claims 1 or 2, wherein the transporting means is capable of delivering a preselected volume of liquid in the range from about 1 ml to 100 ml.

8. A system as in claim 2, further comprising an expansion chamber disposed between the pressure reducing valve and the low pressure reactor.

9. A system as in claim 2, wherein the means for maintaining a pressure below about 500 Torr is a pump.

10. A system as in claim 2, wherein the low pressure reactor is a chemical vapor deposition reactor.

11. A system as in claim 10, wherein the source of liquid reagent comprises a liquid reagent selected from the group consisting of trichlorosilane, dichlorosilane, tetraethylorthosilicate, trimethylborate, triethylborate, trichloroethane, boron tribromide, and phosphorus oxychloride.

12. A method for delivering a liquid reagent in vaporized form to a low pressure reactor, said method comprising:
   transporting a preselected volume of the liquid reagent to a pressure reducing valve;
   adjusting an orifice of the pressure reducing valve in response to the liquid reagent pressure upstream of the pressure reducing valve, where the orifice size is increased as the upstream pressure increases and decreased as the upstream pressure decreases, whereby downstream pressure perturbances are minimized; and
   delivering the vaporized reagent to the low pressure reactor.

13. A method as in claim 12, wherein the liquid reagent is selected from the group consisting of trichlorosilane, dichlorosilane, tetraethylorthosilicate, trimethylborate, triethylborate, trichloroethane, boron tribromide, and phosphorus oxychloride.

14. A method as in claim 12, wherein the liquid reagent is at about ambient pressure and the low pressure reactor is at a pressure below about 500 Torr.

15. A method as in claim 12, wherein the volume of the liquid reagent is below about 500 ml.

16. A method as in claim 12, wherein the liquid reagent is transported to the pressure reducing valve at a rate in the range from about 1 ml/min to 100 ml/min.

17. A method as in claim 12, wherein the orifice size is adjusted proportionally to increases and decreases in upstream liquid reagent pressure.

18. A method as in claim 12, further comprising passing the vaporized reagent through an expansion chamber located downstream of the pressure reducing valve as the vaporized reagent is being delivered to the low pressure reactor.

19. A method as in claim 12, wherein the liquid volume is transported with a pressure-balanced bellows pump.

* * * * *